(12) United States Patent
Kobayashi et al.

(10) Patent No.: US 7,332,027 B2
(45) Date of Patent: Feb. 19, 2008

(54) METHOD FOR MANUFACTURING ALUMINUM NITRIDE SINGLE CRYSTAL

(75) Inventors: Yoshimasa Kobayashi, Nagoya (JP); Toru Hayase, Nagoya (JP); Naohito Yamada, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 155 days.

(21) Appl. No.: 11/172,108

(22) Filed: Jun. 30, 2005

(65) Prior Publication Data

US 2006/0006395 A1   Jan. 12, 2006

(30) Foreign Application Priority Data

Jul. 8, 2004   (JP) ............................ 2004-201646
Jun. 1, 2005   (JP) ............................ 2005-160809

(51) Int. Cl.
*C30B 25/12*   (2006.01)

(52) U.S. Cl. ................. 117/4; 117/3; 117/937

(58) Field of Classification Search .............. 117/3, 117/4, 937
See application file for complete search history.

(56) References Cited

U.S. PATENT DOCUMENTS

| 5,954,874 A | 9/1999 | Hunter |
| 6,001,748 A | 12/1999 | Tanaka et al. |
| 6,066,205 A | 5/2000 | Hunter |

FOREIGN PATENT DOCUMENTS

| JP | 10-53495 | 2/1998 |
| JP | 2003-505331 | 2/2003 |

*Primary Examiner*—Felisa Hiteshew
(74) *Attorney, Agent, or Firm*—Burr & Brown (57) ABSTRACT

A method for manufacturing an aluminum nitride single crystal is provided, including the steps of preparing a raw material composition containing aluminum oxide and/or an aluminum oxide precursor which is converted into aluminum oxide by heating, and aluminum nitride and/or an aluminum nitride precursor which is converted into aluminum nitride by heating, heating the raw material composition at 1600 to 2400° C. to synthesize aluminum nitride, and causing crystal growth of the aluminum nitride to obtain an aluminum nitride single crystal.

16 Claims, 4 Drawing Sheets
(1 of 4 Drawing Sheet(s) Filed in Color)

METHOD FOR MANUFACTURING ALUMINUM NITRIDE SINGLE CRYSTAL

This application claims the benefit of Japanese Application No. 2004-201646, filed Jul. 8, 2004, and Japanese Application 2005-160809, filed Jun. 1, 2005, the entireties of which are incorporated herein by reference.

This application claims the benefit of Japanese Application No 2004-201646, filed Jul. 8, 2004, and Japanese Application No. 2005-160809, filed Jun. 1, 2005, the entireties of which are incorporated herein by reference.

BACKGROUND OF THE INVENTION AND RELATED ART STATEMENT

The present invention relates to a method for manufacturing an aluminum nitride (AlN) single crystal useful as a dispersant (filler) for improving mechanical strength and heat radiation ability, or as a substrate material, heat radiating material, or structural material for parts for electronics or electrical machinery and appliances, particularly as a material for applications having a high heating value such as a semi-conductive laser element and a light-emitting diode.

In apparatuses and devices using parts having a high heating values, such as parts for electronics or electrical machinery and appliances, optical apparatuses, or OA apparatuses, quick radiation of heat generated is required. Therefore, as a substrate material and a heat radiation material (heat sink), which are brought into contact with these parts, or as a structural material (hereinbelow referred to as a "substrate material or the like") for these parts, there has conventionally been employed metallic material having high thermal conductivity and excellent heat radiation ability (e.g., aluminum (Al) and cupper (Cu)).

However, in recent years, apparatuses and devices using such parts have tended to be minimized and densified and to raise output. The level of heat radiation ability required to a substrate material or the like has become higher. In addition, in some cases, properties such as mechanical strength and electric insulation, which cannot be imparted sufficiently to a metallic material, are required. In view of such a background, aluminum nitride is now employed as the substrate material or the like, which is excellent in various properties such as mechanical strength, thermal resistance, corrosion resistance, and electric insulation in addition to heat radiation ability.

It is generally known that a sintered body of aluminum nitride is used as a structural material for a substrate material or the like. However, attention has recently been paid to an aluminum nitride single crystal (bulk single crystal or whisker), which may be able to constitute a substrate material or the like having higher performance. A bulk single crystal is expected to be used as a substrate material or the like by the use of heat radiation ability thereof similarly to a sintered body, as a semi-conductive laser element or a light-emitting diode because of its wide energy-band gap (6.2 eV), and as a substrate material for a semi-conductive laser element or a light-emitting diode because it has the same extent of lattice constant and thermal expansion coefficient as those of gallium nitride (GaN). Meanwhile, a whisker is also expected to be used as a dispersant (filler) for improving mechanical strength and heat radiation ability of metals and plastics because of its excellent mechanical strength and heat radiation ability.

As methods for manufacturing an aluminum nitride single crystal, various methods such as nitriding, fluxing, chemical transportation, sublimation, and chemical vapor phase synthesis have been known. However, since aluminum nitride is stable against heat, it hardly melts even under the condition of high temperature, and it is very difficult to grow a large crystal. Therefore, very few examples of manufacturing an aluminum nitride single crystal with a sufficient size for practical use as a substrate material or the like have been reported.

Some of the very few examples will be shown. For example, there has been reported a method for manufacturing a nitride single crystal, the method being characterized by mixing oxide powder, which reacts with the nitride under heating to decompose and gasify nitride, with a nitride powder to obtain a mixed powder; heating the mixed powder at a temperature lower than the sublimation temperature or melt temperature of the nitride in a nitrogen atmosphere or the like; and subjecting the decomposed gasified component to crystal growth on a substrate from a vapor phase (see JP-A-10-53495). According to this method, it is considered that an aluminum nitride single crystal with dimensions of 10 mm×10 mm or more and a thickness of 300 μm or more, which is sufficiently large as a bulk material, can be obtained.

There has also been reported a method for manufacturing an aluminum nitride bulk single crystal, characterized by brining nitrogen into contact with a molten metal aluminum to form aluminum nitride in the molten body, and allowing the aluminum nitride to accumulate on a seed crystal which is in physical contact with the molten body (see JP-A-2003-505331). According to this method, it is considered that an aluminum nitride crystal having a diameter of 1 inch (about 2.5 cm) or more can be obtained.

However, there is still room for improvement from the viewpoint of productivity, since it takes a long time by using the above methods to grow an aluminum nitride single crystal sufficiently large for practical use as a dispersant for improving mechanical strength and heat radiation ability or as a substrate material or the like of parts for electronics or electrical machinery and appliances.

To be concrete, it is considered that the method described in JP-A-10-53495 has a low crystal-growth speed because of the long hold time of about 24 hours at the reaction temperature. Therefore, this method cannot give satisfactory crystal-growth speed considering practical use on an industrial level, and it therefore has a problem from the viewpoint of productivity and cost. Though the method described in JP-A-2003-505331 can achieve a relatively high crystal-growth speed of about 1.6 mm/hour, the method requires an expensive special device provided with complex mechanisms such as a nitrogen gas injector, a crystal raiser, and various controllers. Since this method cannot employ a widely used device and lacks wide usability, it is not necessarily suitable for practical use on an industrial level. That is, a method for manufacturing an aluminum nitride single crystal has never been disclosed as being capable of obtaining an aluminum nitride single crystal which is sufficiently large for practical use at low cost in a short time and having high productivity and wide usability, and such a method is earnestly desired by the industrial world.

SUMMARY OF THE INVENTION

The present invention has been made to solve the aforementioned problems of conventional art and provides a method for manufacturing an aluminum nitride single crystal, the method being more effective in being capable of obtaining an aluminum nitride single crystal which is sufficiently large for practical use at low cost in a short time and having high productivity and wide usability in comparison with conventional methods.

The present invention have eagerly studied to solve the aforementioned problems and, as a result, found out that the aforementioned problems can be solved by heating a raw material composition containing aluminum oxide and aluminum nitride at 1600 to 2400° C. to synthesize aluminum nitride, which is then subjected to crystal growth. Thus, the present invention was led to completion. That is, according to the present invention, a method for manufacturing an aluminum nitride single crystal is provided, comprising the steps of preparing a raw material composition containing aluminum oxide ($Al_2O_3$) and/or an aluminum oxide precursor which is converted into aluminum oxide by heating, and aluminum nitride (AlN) and/or an aluminum nitride precursor which is converted into aluminum nitride by heating, heating the raw material composition at 1600 to 2400° C. to synthesize aluminum nitride, and causing crystal growth of the aluminum nitride to obtain an aluminum nitride single crystal.

According to one aspect of the method for manufacturing an aluminum nitride single crystal according to the present invention, the raw material composition satisfies a relationship shown by the following formula (1):

$$(N_{AO}+N_{AO\text{-}pre}):(N_{AN}+N_{AN\text{-}pre})=95:5 \text{ to } 10:90 \tag{1}$$

wherein $N_{AO}$ represents a molar number of aluminum oxide, $N_{AO\text{-}pre}$ represents a molar number of aluminum oxide precursor in terms of aluminum oxide. $N_{AN}$ represents a molar number of aluminum nitride, and $N_{AN\text{-}pre}$ represents molar number of aluminum nitride precursor in terms of aluminum nitride.

The present invention also provides a method for manufacturing an aluminum nitride single crystal comprising the steps of preparing a raw material composition containing aluminum oxynitride and/or an aluminum oxynitride precursor which is converted into aluminum oxynitride by heating, heating the raw material composition at 1600 to 2400° C. to synthesize aluminum nitride, and causing crystal growth of the aluminum nitride to obtain an aluminum nitride single crystal.

According to this method for manufacturing an aluminum nitride single crystal according to the present invention, the aluminum oxynitride is at least one selected from the group consisting of $Al_{22}O_{30}N_2$, $Al_{23}O_{27}N_5$, $Al_6O_3N_4$, $Al_7O_8N_5$, and $Al_9O_8N_7$.

According to another aspect of the methods for manufacturing an aluminum nitride single crystal according to the present invention, the synthesis and the crystal growth of the aluminum nitride is performed in the presence of carbon.

According to another aspect of the method for manufacturing an aluminum nitride single crystal according to the present invention, the synthesis and the crystal growth of aluminum nitride is performed in a graphite or nitride reaction container.

The method for manufacturing an aluminum nitride single crystal according to the present invention also provides that the synthesis and the crystal growth of the aluminum nitride is performed in a reaction atmosphere containing nitrogen gas and/or nitrogen compound gas with a partial pressure of the nitrogen gas and/or the nitrogen compound gas being 1 kPa to 1 MPa.

The present invention also provides that the synthesis and the crystal growth of the aluminum nitride is performed under the condition that powdery carbon (carbon powder) is used as the carbon and that the carbon powder is mixed with the raw material composition.

According to another aspect of the methods for manufacturing an aluminum nitride single crystal according to the present invention, a single crystal substrate is present in the reaction atmosphere to cause the crystal growth of the aluminum nitride on a surface of the single crystal substrate. In this case, the crystal growth of the aluminum nitride is preferably performed under the condition that the temperature difference between the raw material composition and the single crystal substrate is controlled to be 20° C. or more.

The manufacturing method according to the present invention more effectively obtains an aluminum nitride single crystal which is sufficiently large for practical use at low cost in a short time and having high productivity and wide usability in comparison with conventional methods.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

DETAILED DESCRIPTION OF THE INVENTION

The best mode for carrying out a method for manufacturing an aluminum nitride single crystal according to the present invention will hereinbelow be described specifically. However, a manufacture method of the present invention is by no means limited to the following embodiments.

In a method for manufacturing an aluminum nitride single crystal of the present invention, a raw material composition containing aluminum oxide and aluminum nitride is heated at 1600 to 2400° C. to synthesize aluminum nitride, which is then subjected to crystal growth. Such a method is more effective in being capable of obtaining an aluminum nitride single crystal which is sufficiently large for practical use as a dispersant for improving mechanical strength or heat radiation ability, or as a substrate material, or the like, for parts for electronics or electrical machinery and appliances at low cost in a short time and having high productivity and wide usability in comparison with conventional methods. Incidentally, the term "aluminum nitride single crystal" used in the present specification includes whisker besides aluminum nitride platy single crystal, needle-shaped single crystal, and bulk single crystal.

Raw Material Composition

In the manufacturing method of the present invention, a raw material composition containing aluminum oxide is used. Though there are some cases of using metal aluminum instead of aluminum oxide, metal aluminum is not preferable for the following points. That is, though metal aluminum melts and volatilizes at low temperature, a nitride film is prone to be formed on a surface of molten matter. Therefore, the volatilization and synthesis reaction is hindered, which is a problem. In addition, though it is considered to be advantageous to conduct synthesis and crystal growth at a high temperature to obtain a large single crystal, metal aluminum, which melts and volatilizes at low temperature, is not suitable for such a reaction.

On the other hand, in the case of using aluminum oxide as a raw material, aluminum nitride is formed by the reaction shown by the following formula (2). To be concrete, the reducing reaction shown by the following formula (2-1) proceeds to form $Al_2O$, which is a gaseous molecule, and then, as shown by the following formula (2-2), $Al_2O$ (or a derivative thereof) reacts with nitrogen to form aluminum nitride. This method uses $Al_2O$ as a source for an aluminum nitride single crystal. Since the volatilization speed of $Al_2O$ is relatively high, it is advantageous from the point of accelerating crystal growth speed.

$$Al_2O_3 + 3C + N_2 \rightarrow 2AlN + 3CO \quad (2)$$

$$Al_2O_3 + 2C \rightarrow 2Al_2O + 2CO \quad (2\text{-}1)$$

$$Al_2O + C + N_2 \rightarrow 2AlN + CO \quad (2\text{-}2)$$

Since the manufacturing method of the present invention includes a step of heating a raw material composition at a high temperature, an aluminum oxide precursor which is converted into aluminum oxide by heating may be used instead of a part of or the whole aluminum oxide contained in the raw material composition. Examples of an aluminum oxide precursor include aluminum hydroxide $(Al(OH)_3)$, aluminum sulfate $(Al_2(SO_4)_3)$, and aluminum alkoxide $(Al(RO)_3)$, where R represents alkyl group). Among them, aluminum hydroxide can suitable be used from the viewpoint of requiring no apparatus for removing acid gas as a by-product unlike the case of aluminum sulfate and from the viewpoint of inexpensive cost for raw material unlike metal alkoxide.

The manufacturing method of the present invention is characterized by using a raw material composition containing aluminum nitride besides the aforementioned aluminum oxide. Though an aluminum nitride formation process in the case of using a raw material composition containing aluminum oxide and aluminum nitride has not been clear yet, it is considered that $Al_2O$ as a source of an aluminum nitride single crystal can be formed directly (see the following formula (3)) by the reaction of aluminum oxide with aluminum nitride by allowing a raw material composition to contain aluminum nitride, or indirectly (see the following formulae (4) to (8)) via aluminum oxynitride formed by the reaction of aluminum oxide with aluminum nitride.

$$Al_2O_3(s) + 4AlN(s) \rightarrow 3Al_2O(g) + 2N_2(g) \quad (3)$$

$$Al_{22}O_{30}N_2(s) + 20C(s) \rightarrow 10Al_2O(g) + 2AlN(S) + 20CO(g) \quad (4)$$

$$Al_{23}O_{27}N_5(s) + 18C(s) \rightarrow 9Al_2O(g) + 5AlN(s) + 18CO(g) \quad (5)$$

$$Al_6O_3N_4(s) \rightarrow 3Al_2O(g) + 2N_2(g) \quad (6)$$

$$Al_7O_3N_5(s) \rightarrow 3Al_2O(g) + AlN(s) + 2N_2(g) \quad (7)$$

$$Al_9O_3N_7(s) \rightarrow 3Al_2O(g) + 3AlN(s) + 2N_2(g) \quad (8)$$

Since the manufacturing method of the present invention has a tendency to easily form a crystalline nucleus of aluminum nitride in comparison with the case of using only aluminum oxide shown in the above formula (2), the method is suitable for manufacturing an aluminum nitride single crystal. According to such a method, crystal growth of aluminum nitride is accelerated, and an aluminum nitride single crystal which is sufficiently large for practical use can be manufactured in a short time. Of all, a method in which $Al_2O$ is indirectly formed via aluminum oxynitride formed by the reaction of aluminum oxide with aluminum nitride as shown in the above formulae (4) to (8) is preferable from the viewpoint of stably manufacturing highly qualified aluminum nitride single crystal.

Further, the manufacturing method of the present invention can provide a colorless, transparent aluminum nitride single crystal and, advantageously, it is difficult to lower thermal conductivity of the single crystal. This is because of a low volume ratio of carbon monoxide formed as a by-product when aluminum nitride is formed as shown in the above formulae (3) to (8). In particular, a method where $Al_2O$ is indirectly formed via aluminum oxynitride as shown in the above formulae (6) to (8) is preferable because it has a very low volume ratio of carbon monoxide formed as a by-product. On the other hand, in the case of using only aluminum oxide as a raw material, a large amount of carbon monoxide is formed in the reaction system and causes solid solution in a formed aluminum nitride single crystal, and thereby a single crystal is sometimes blue-colored or deteriorated in thermal conductivity.

Incidentally, an example of using an aluminum nitride coarse crystal alone as an aluminum source upon aluminum nitride synthesis is known. However, such a method differs in technical concept from the method of the present invention and has the following problems. That is, since an aluminum nitride coarse crystal has a high sublimation temperature and a low sublimation speed, it is difficult to obtain sufficient crystal-growth speed at low temperature. Since crystal growth at high temperature requires a special device capable of coping with such a high temperature, the method has a problem of being defective in wide usability. In addition, in the case of using aluminum nitride alone as a raw material, there is a problem of high production cost due to high cost of the raw material.

On the other hand, it has conventionally been technical common sense that a method using a mixture of aluminum oxide and aluminum nitride as a raw material is not a preferable method because an aluminum oxynitride by-product is expected judging from constitutional diagrams of these materials.

However, the present inventors found a method where an aluminum nitride single crystal can be obtained without remaining aluminum oxynitride, even when a mixture of aluminum oxide and aluminum nitride is used as a raw material. Such a method can accelerate crystal-growth speed and lower crystal-growth temperature and has the advantage in being capable of using a widely used device. Further, it has the advantage of low production cost due to a low raw material cost over a method using an aluminum nitride coarse crystal alone.

In addition, since the method of the present invention contains a step of heating a raw material composition at a high temperature, an aluminum nitride precursor which can be converted into aluminum nitride by heating may be used instead of a part of or the whole aluminum nitride contained in the raw material. Examples of an aluminum nitride precursor include metal aluminum, aluminum carbide (e.g., $Al_1C_3$ or $Al_2C_6$), Boehmite ($AlO(OH)$ or $Al_2O_3 \cdot H_2$), and aluminum chloride ($AlCl_3$). Aluminum nitride can preferably be used from the viewpoint of stability and handleability.

Further, in the method of the present invention, the raw material composition may contain a material where aluminum oxide and aluminum nitride coexist like partially oxidized aluminum nitride (for example, aluminum nitride where a surface portion of an aluminum nitride powder is oxidized) or like partially nitrided aluminum oxide. Using such a raw material composition, synthesis and crystal growth of aluminum nitride is possible under similar conditions.

Though the forms of aluminum oxide and aluminum nitride are not particularly limited, it is preferable to use powder from the viewpoint of being easily mixed and to promote easy reaction progress.

Though the composition of the raw material composition is not particularly limited, it preferably satisfies the following formula (1), more preferably satisfies the following formula (9), and particularly preferably satisfies the following formula (10):

$$(N_{AO}+N_{AO\text{-}pre}):(N_{AN}+N_{AN\text{-}pre})=95:5 \text{ to } 10:90 \quad (1)$$

$$(N_{AO}+N_{AO\text{-}pre}):(N_{AN}+N_{AN\text{-}pre})=90:10 \text{ to } 12:88 \quad (9)$$

$$(N_{AO}+N_{AO\text{-}pre}):(N_{AN}+N_{AN\text{-}pre})=80:20 \text{ to } 17:83 \quad (10)$$

(where $N_{AO}$ represents a molar number of aluminum oxide. $N_{AO\text{-}pre}$ represents a molar number of aluminum oxide precursor in terms of aluminum oxide, $N_{AN}$ represents a molar number of aluminum nitride, and $N_{AN\text{-}pre}$ represents a molar number of aluminum nitride precursor in terms of aluminum nitride).

When the ratio of aluminum oxide exceeds the above range, the partial pressure of carbon monoxide rises during crystal formation, which is prone to cause coloring or deterioration in thermal conductivity of a formed aluminum nitride single crystal, which is not preferable. On the other hand, when the ratio of aluminum nitride exceeds the above range, it raises the raw material-volatilizing temperature and crystal-forming temperature in addition to increasing the amount of aluminum nitride which does not contribute to the reaction. Therefore, it is not preferable from the viewpoint of being prone to lower yield and crystal-growth speed.

The above raw material composition can be obtained by weighing each of raw materials and mixing them according to a conventionally known mixing method involving a conventionally known mixer or grinder (e.g., ball mill and media-type grinder). In the case of mixing a small amount of raw material composition, the mixing may be conducted by a method where the raw materials are put in a bag, container, or the like, to be shaken (hand mixing).

In the method of the present invention, it is also preferable to use a raw material composition containing aluminum oxynitride instead of a raw material composition containing aluminum oxide and aluminum nitride. With respect to the raw material composition containing aluminum oxynitride, synthesis and crystal growth of aluminum nitride can be conducted under similar conditions as those for the raw material composition containing aluminum oxide and aluminum nitride.

In the present specification, the term "aluminum oxynitride" means a compound shown by the general formula, $Al_xO_yN_z$ (where x, y, and z each denotes an integer of 1 or higher), for example, $Al_{22}O_{30}N_2$, $Al_{23}O_{27}N_5$, $Al_6O_3N_4$, $Al_7O_3N_5$, and $Al_9O_3N_7$. Compounds where aluminum oxide or aluminum nitride is solid-solved in these compounds are also included in "aluminum oxynitride" of the present specification.

In the case of using a raw material composition containing aluminum oxide and aluminum nitride, an aluminum nitride crystal is formed by a gas component volatilized from a liquid phase. Meanwhile, in the case of using a raw material composition containing aluminum oxynitride, an aluminum nitride crystal is formed by a gas component volatilized from a solid phase, which enables the manufacture of a highly purified aluminum nitride single crystal. In particular, in the case of using aluminum oxynitride powder as a raw material, it has an advantage of rapid crystal growth because of its large surface area.

It is preferable to use a raw material composition containing aluminum oxynitride because the formation of a carbon monoxide by-product is suppressed, and coloring or deterioration in thermal conductivity of a formed aluminum nitride single crystal is effectively inhibited. This is because of a low volume ratio of a carbon monoxide by-product formed when the aluminum nitride is formed as shown in the above formulae (3) to (8). Particularly, it is preferable to use aluminum oxynitride shown in the above formulae (6) to (8) ($Al_6O_3N_4$, $Al_7O_3N_5$, or $Al_9O_3N_7$) because the volume ratio of carbon monoxide formed as a by-product becomes very low.

Figure 1:
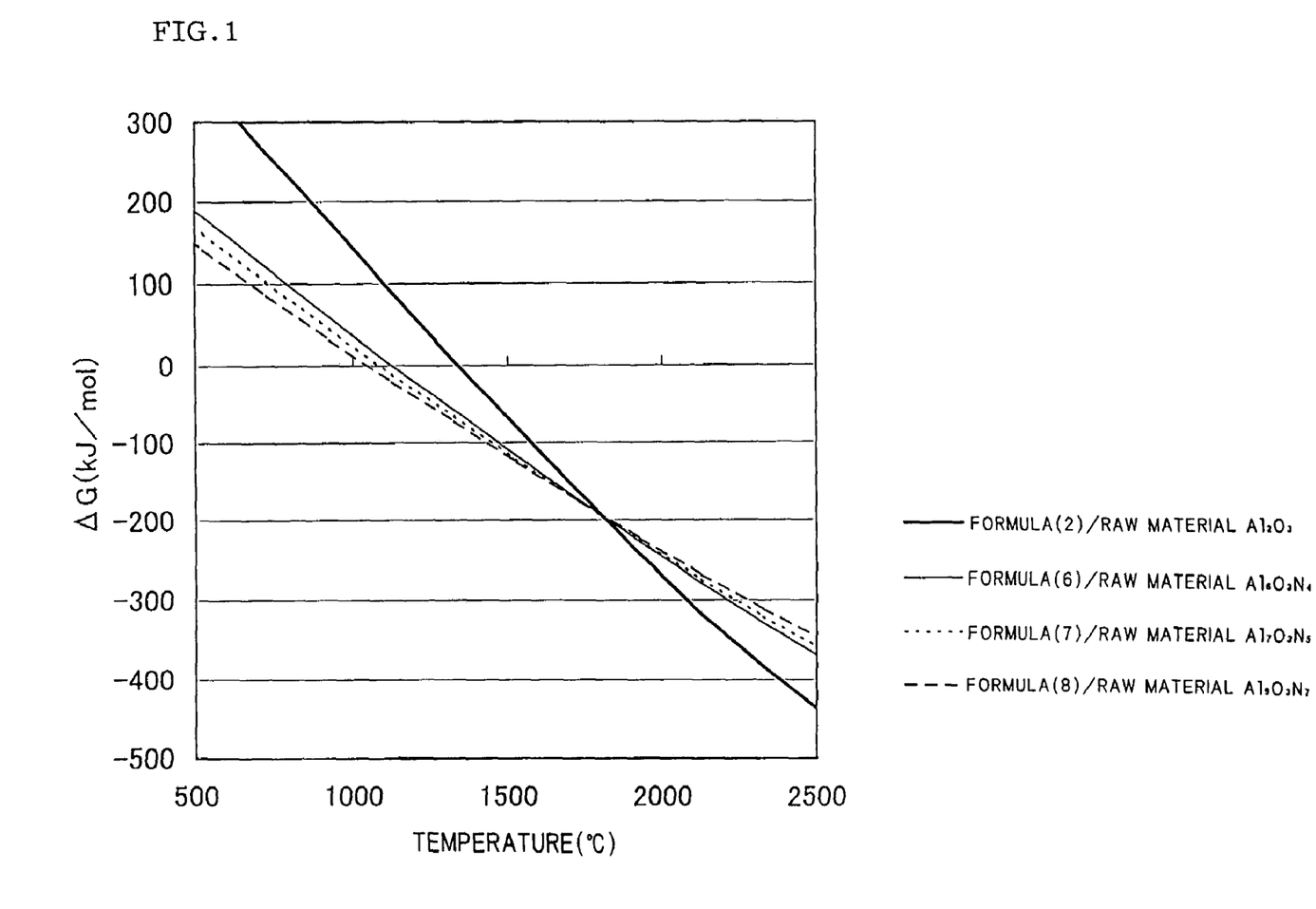
FIG. 1 is a graph showing a correlation between temperature and Gibbs free energy with respect to each of the reactions shown by the formulae (2) and (6) to (8).

Further, it is preferable to use a raw material composition containing aluminum oxynitride also from the viewpoint of being capable of progressing at a lower reaction temperature. FIG. 1 is a graph showing the correlation between temperature and Gibbs free energy ($\Delta G$) with respect to each of the reactions shown by the formulae (2) and (6) to (8). As is clear from this graph, the reaction shown by the above formulae (6) to (8) using aluminum oxynitride as a raw material makes progress from around 1100° C. On the other hand, the reaction shown by the above formula (2) using aluminum oxide as a raw material does not make progress until the temperature reaches around 1400° C.

Figure 2:
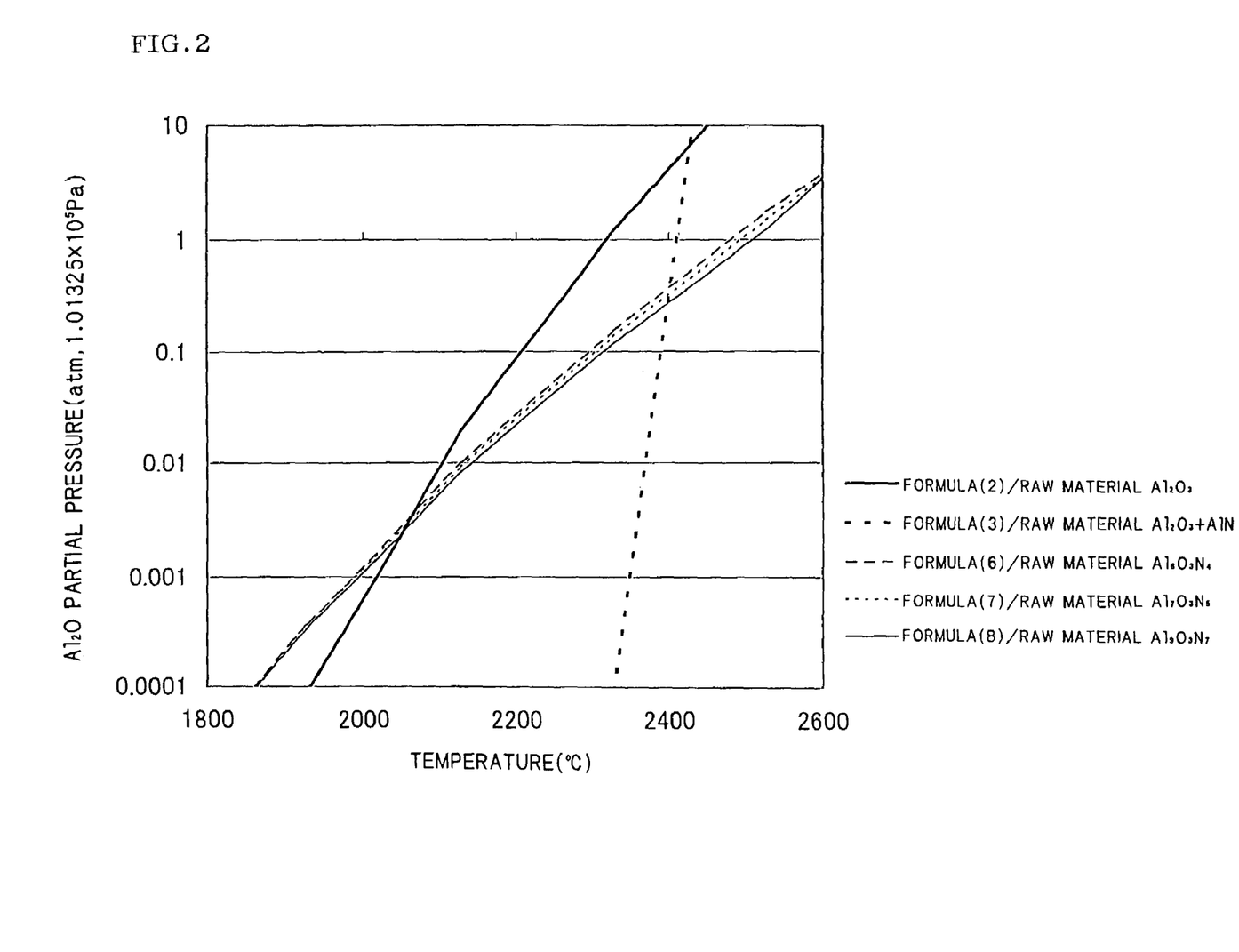
FIG. 2 is a graph showing a correlation between temperature and $Al_2O$ partial pressure with respect to each of the reactions shown by the formulae (2), (3) and (6) to (8).

Furthermore, it is preferable to use aluminum oxynitride shown in the above formulae (6) to (8) ($Al_6O_3N_4$, $Al_7O_3N_5$, or $Al_9O_3N_7$) because deviation in raw material composition due to nitriding or the like of the raw material composition is hardly caused and the raw material composition is hardly influenced by reaction temperature during crystal formation, and thereby a highly qualified aluminum nitride single crystal can stably be manufactured. FIG. 2 is a graph showing the correlation between the temperature and the $Al_2O$ partial pressure with respect to each of the reactions shown by the formulae (2), (3) and (6) to (8). As is clear from this graph, the use of aluminum oxynitride shown by the above formulae (6) to (8) as the raw material makes inclination of the straight line gentle and can stably supply $Al_2O$ as a source of an aluminum nitride single crystal even if the temperature changes. That is, the material is hardly influenced by the reaction temperature, and a high quality aluminum nitride single crystal can stably be manufactured. On the other hand, in the reaction of the above formula (2) using aluminum oxide as the raw material and the reaction of the above formula (3) using aluminum oxide and aluminum nitride as the raw material, a supply amount of $Al_2O$ is changed in accordance with temperature change. Therefore, the quality of the aluminum nitride single crystal can be influenced by reaction temperature.

(2) Synthesis and Crystal Growth of Aluminum Nitride

In a method of the present invention, the aforementioned raw material composition is heated at 1600 to 2400° C. Under such conditions, the desired aluminum nitride is synthesized and the aluminum nitride is subjected to crystal growth to give an aluminum nitride single crystal.

Since the reaction is conducted in a non-oxygen atmosphere to inhibit formed aluminum nitride from being oxidized in the method of the present invention, it is preferable to cause reaction and crystal growth in an inert gas-containing atmosphere such as nitrogen, helium, and argon. In the method of the present invention, a nitrogen compound capable of serving as a nitrogen source of aluminum nitride or aluminum oxynitride is contained in the raw material composition. It is not necessary to conduct synthesis and crystal growth in an atmosphere containing nitrogen gas or a nitrogen compound gas (e.g., ammonia ($NH_3$)), which can be a nitrogen source. However, it is preferable to conduct synthesis and crystal growth in an atmosphere containing nitrogen gas or a nitrogen compound gas from the view point of stabilizing formed aluminum nitride and accelerating the formation reaction of aluminum nitride. Among them, it is particularly preferable to conduct synthesis and crystal growth in an atmosphere containing nitrogen gas in that it does not require an apparatus for removing a nitrogen compound such as ammonia discharged from the reaction system.

Though the pressure of the reaction atmosphere is not particularly limited, the reaction is conducted in a reaction atmosphere under a partial pressure of nitrogen gas and/or nitrogen compound gas of preferably 1 kPa to 1 MPa or less, more preferably 10 to 500 kPa, and particularly preferably 10 to 200 kPa. When the partial pressure is below the aforementioned range, formed aluminum nitride may become unstable and decompose, thereby crystal-growth speed of aluminum nitride may be lowered, which is not preferable. When the partial pressure is above the aforementioned range, raw materials such as aluminum oxide and aluminum oxynitride are easily nitrided, and it is apprehended that the effect of accelerating crystal growth is not exhibited sufficiently, which is not preferable.

In addition, though the oxygen concentration of the reaction atmosphere is not particularly limited, it is considered that it is preferable to control the concentration generally 1 mol % or less. When it exceeds the range, there is a possibility of deterioration in quality of the aluminum nitride crystal due to solid solution of oxygen in the crystal obtained, which is not preferable.

In the method of the present invention, it is preferable to conduct reaction of synthesis and crystal growth of aluminum nitride in the presence of carbon. This is because carbon as a aluminum oxide reducing agent is made present in the reaction system because aluminum oxide is used as an aluminum source of aluminum nitride.

The method of conducting a reaction in the presence of carbon is exemplified by a method using a graphite reaction container or heating apparatus. To be concrete, there may suitably be employed a method using a graphite crucible as a reaction container or a method using a graphite heater as a heating apparatus. It is preferable that the synthesis and crystal growth of aluminum nitride is conducted in the condition that carbon powder as carbon is mixed with the raw material composition.

It is also preferable that the synthesis and crystal growth of aluminum nitride is conducted in a nitride reaction container. This is because nitride generally has a high melting point and can be used stably even for a reaction under high-temperature conditions as in the present invention. In the case of using a graphite crucible, a blue-coloring of the single crystal is sometimes caused due to the solid solution of carbon dioxide when molar ratio of aluminum oxide is high in the raw material composition (e.g., aluminum oxide:aluminum nitride=90:10). However, in the case of using a nitride crucible, such a defect can effectively be suppressed. Examples of such a nitride include boron nitride (BN), titanium nitride (TiN), zirconium nitride (ZrN), and aluminum nitride (AlN). Among them, boron nitride, which is more stable, is preferably used.

The reaction in the method of the present invention is necessarily in a range of 1600 to 2400° C., preferably in a range of 2000 to 2300° C., and more preferably in a range of 2100 to 2300° C. When the temperature is below the aforementioned range, the growth speed of an aluminum nitride crystal is lowered because the movement of atoms or molecules concerned in the synthesis of aluminum nitride becomes slow, which is not preferable. On the other hand, when the temperature exceeds the range, the temperature approaches the decomposition temperature of aluminum nitride, and thereby the formed aluminum nitride may become unstable and may be decomposed, which is not preferable.

The optimum temperature conditions in the method of the present invention vary in the range from 1600 to 2400° C. depending on production conditions such as the kind of raw material composition. Under the production conditions, it is preferable to set the temperature within a range from the temperature where $Al_2O$ gas sufficiently volatilizes to the temperature where formed aluminum nitride becomes unstable and decomposes. At this time, in a preferred embodiment, another substance is added to lower the temperature where $Al_2O$ gas sufficiently volatilizes. Examples of such a substance to lower the temperature where $Al_2O$ gas sufficiently volatilizes include alkali metal compound, alkaline earth metal compounds, and transition metal compounds.

In addition, in the case of using a raw material composition containing aluminum oxide (or aluminum oxide precursor) and aluminum nitride (or aluminum nitride precursor), it is preferable that temperature-rising speed is lowered in order to accelerate the formation of aluminum oxynitride in the system. To be concrete, temperature-rising speed within a range of 1000 to 2000° C. is preferably 0.5 to 50° C./min. and more preferably 2 to 20° C./min.

In addition, in the method of the present invention, it is preferable to make a single crystal substrate present in a reaction atmosphere for crystal growth of aluminum nitride on a surface of the single crystal substrate. This crystal growth is epitaxial growth having the same orientation as a single crystal constituting the single crystal substrate and contributes to manufacture of a high quality aluminum nitride single crystal having a large size sufficient for use as substrate material, or the like, for parts for electronics or electrical machinery and appliances and having few crystal defects. There may suitably be used, as a singe crystal constituting the single crystal substrate, sapphire or silicon carbide (SiC), not to mention aluminum nitride.

In the case of thus employing a method where crystal growth of aluminum nitride is caused on a surface of a single crystal substrate, it is more preferable to control the temperature difference between the raw material composition and the single crystal substrate to be 20° C. or more.

By controlling the temperature difference to be 20° C. or more, the crystal growth of aluminum nitride can be accelerated and heat damage of the single crystal substrate can be suppressed. On the other hand, when the temperature difference is below the aforementioned range, a part of highly reactive atoms or molecules which are concerned in the synthesis of aluminum nitride react with the single crystal substrate, and the single crystal substrate may be damaged, which is not preferable. From the viewpoint of suppressing damage in the single crystal substrate, the temperature difference does not have a particular upper limit. However, the temperature difference is preferably controlled at 300° C. or less, more preferably at 200° C. or less, so that a cooling apparatus or the like is not required separately and so that the method can be carried out with a widely used device.

Incidentally, there is no particular limitation on the method for controlling the temperature difference between the raw material composition and the single crystal substrate to be 20° C. or more. An example of the method is where two or more heaters each having independent control system are used to control the temperature around the reaction container to be high and the temperature around the single crystal substrate to be low, thereby giving the temperature inclination in the reaction atmosphere.

The method of the present invention is, as described above, more effective in obtaining an aluminum nitride single crystal which is sufficiently large for practical use at low cost in a short time and having high productivity and wide usability in comparison with conventional methods. It is possible to obtain a platy single crystal having the maximum outer diameter of over 1 cm in a short time of about two hours by setting appropriate conditions.

EXAMPLES

A method for manufacturing an aluminum nitride single crystal of the present invention is hereinbelow described specifically with Examples. However, the present invention is by no means limited by these Examples. In the manufacturing methods in Examples and Comparative Examples, each of the obtained aluminum nitride single crystal was evaluated for size. As a size of each of the single crystals, length and the maximum outer diameter in the case of a needle-shaped single crystal or the maximum outer diameter and thickness in the case of a platy single crystal were evaluated according to the following method. In the present specification and tables, the term "needle-shaped single crystals" includes trigonal prism-shaped single crystals besides needle-shaped single crystals.

Needle-Shaped Single Crystal

With respect to a needle-shaped single crystal, the product after the completion of the reaction was measured for length by visual observation and for the maximum outer diameter by observation with a scanning electron microscope (SEM). In the present specification, the term "the maximum outer diameter" means the length of the longest side in the case that a section perpendicular to the longitudinal direction is triangular, length of the longest diagonal line in the case that a section perpendicular to the longitudinal direction is polygonal (rectangle or more), length of a diameter in the case that a section perpendicular to the longitudinal direction is circular, length of the major axis in the case that a section perpendicular to the longitudinal direction is oval. When the observable maximum crystal is a needle-shaped crystal having a length of 20 mm or more and the maximum outer diameter of 0.5 mm or more, evaluation was given as "excellent." When the observable maximum crystal is a needle-shaped crystal having a length of 10 mm or more and the maximum outer diameter of 0.5 mm or more, evaluation was given as "good." When the observable maximum crystal is a needle-shaped crystal having a length of 5 mm or more and the maximum outer diameter of 0.2 mm or more, evaluation was given as "fair." When a needle-shaped crystal having a length of 5 mm or more and the maximum outer diameter of 0.2 mm or more is not observed, evaluation was given as "bad."

Platy Single Crystal

With respect to a platy single crystal, the product after the completion of the reaction was measured for the maximum outer diameter by visual observation and for thickness by observation with an optical microscope. When the observable maximum crystal is a platy single crystal having the maximum outer diameter of 10 mm or more and a thickness of 0.5 mm or more, evaluation was given as "excellent." When the observable maximum crystal is a platy single crystal having the maximum outer diameter of 5 mm or more and a thickness of 0.2 mm or more, evaluation was given as "good." When the observable maximum crystal is a platy single crystal having the maximum outer diameter of 1 or more and a thickness of 0.1 mm ore more, evaluation was given as "fair." When a platy single crystal having the maximum outer diameter of 1 mm or more and a thickness of 0.1 mm or more is not observed, evaluation was given as "bad."

Examples 1 to 19, Comparative Examples 1 To 6

Each of raw material compositions was prepared by mixing aluminum oxide with aluminum nitride at the molar ratio shown in Table 1. For the mixing, aluminum oxide and aluminum nitride were put in a polyethylene bag, which was then shaken.

TABLE 1

| | Molar ratio of raw material composition | | Conditions for reaction and crystal growth | | | | Single crystal Size | |
|---|---|---|---|---|---|---|---|---|
| | Aluminum oxide/ Aluminum oxide precursor | Aluminum nitride/ Aluminum nitride precursor | Temperature (° C.) | Atmosphere | Atmosphereic pressure (kPa) | Shape condition | Needle-shaped crystal | Platy crystal |
| Example 1 | Aluminum oxide (90) | Aluminum nitride (10) | 2200 | Nitrogen | 100(1 atm) | Needle, plate, | Good | Fair |
| Example 2 | Aluminum oxide (80) | Aluminum nitride (20) | 2250 | Nitrogen | 100(1 atm) | Needle, plate, bulk | Excellent | Good |
| Example 3 | Aluminum oxide (70) | Aluminum nitride (30) | 2200 | Nitrogen | 100(1 atm) | Needle, plate, bulk | Excellent | Fair |
| Example 4 | Aluminum oxide (65) | Aluminum nitride (35) | 2125 | Nitrogen | 100(1 atm) | Plate, | Fair | Good |
| Example 5 | Aluminum oxide (65) | Aluminum nitride (35) | 2200 | Nitrogen | 100(1 atm) | Needle, plate, bulk | Excellent | Excellent |

TABLE 1-continued

| | Molar ratio of raw material composition | | Conditions for reaction and crystal growth | | | Single crystal | Size | |
|---|---|---|---|---|---|---|---|---|
| | Aluminum oxide/ Aluminum oxide precursor | Aluminum nitride/ Aluminum nitride precursor | Temperature (° C.) | Atmosphere | Atmosphereic pressure (kPa) | Shape condition | Needle-shaped crystal | Platy crystal |
| Example 6 | Aluminum oxide (65) | Aluminum nitride (35) | 2250 | Nitrogen | 100(1 atm) | Needle, plate, bulk | Fair | Excellent |
| Example 7 | Aluminum oxide (65) | Aluminum nitride (35) | 2200 | Nitrogen | 200(2 atm) | Needle, plate, | Fair | Good |
| Example 8 | Aluminum oxide (65) | Aluminum nitride (35) | 2200 | Nitrogen | 500(5 atm) | Needle, plate, | Fair | Good |
| Example 9 | Aluminum oxide (65) | Aluminum nitride (35) | 2200 | Argon | 500(5 atm) | Plate, | Fair | Good |
| Example 10 | Aluminum oxide (60) | Aluminum nitride (40) | 2150 | Nitrogen | 100(1 atm) | Needle, plate, | Excellent | Good |
| Example 11 | Aluminum oxide (60) | Aluminum nitride (40) | 2200 | Nitrogen | 100(1 atm) | Plate, | Fair | Excellent |
| Example 12 | Aluminum oxide (60) | Aluminum nitride (40) | 2250 | Nitrogen | 100(1 atm) | Needle, plate, | Fair | Good |
| Example 13 | Aluminum oxide (60) | Aluminum nitride (40) | 2200 | Nitrogen | 200(2 atm) | Needle, plate, | Fair | Good |
| Example 14 | Aluminum oxide (60) | Aluminum nitride (40) | 2200 | Nitrogen | 500(5 atm) | Needle, plate, | Fair | Good |
| Example 15 | Aluminum oxide (55) | Aluminum nitride (45) | 2200 | Nitrogen | 100(1 atm) | Needle, plate, | Fair | Excellent |
| Example 16 | Aluminum oxide (55) | Aluminum nitride (45) | 2250 | Nitrogen | 100(1 atm) | Needle, plate, | Excellent | Excellent |
| Example 17 | Aluminum oxide (50) | Aluminum nitride (50) | 2200 | Nitrogen | 100(1 atm) | Needle, plate, | Good | Excellent |
| Example 18 | Aluminum oxide (50) | Aluminum nitride (50) | 2250 | Nitrogen | 100(1 atm) | Needle, plate, | Fair | Good |
| Example 19 | Aluminum oxide (40) | Aluminum nitride (60) | 2200 | Nitrogen | 100(1 atm) | Needle, plate, | Fair | Good |
| Comp. Ex. 1 | — | Aluminum nitride (100) | 2125 | Nitrogen | 100(1 atm) | No crystal formed | bad | bad |
| Comp. Ex. 2 | — | Aluminum nitride (100) | 2150 | Nitrogen | 100(1 atm) | No crystal formed | bad | bad |
| Comp. Ex. 3 | — | Aluminum nitride (100) | 2200 | Nitrogen | 100(1 atm) | No crystal formed | bad | bad |
| Comp. Ex. 4 | — | Aluminum nitride (100) | 2250 | Nitrogen | 100(1 atm) | No crystal formed | bad | bad |
| Comp. Ex. 5 | — | Aluminum nitride (100) | 2250 | Nitrogen | 500(5 atm) | No crystal formed | bad | bad |
| Comp. Ex. 6 | Aluminum oxide (100) | — | 2250 | Nitrogen | 100(1 atm) | No crystal formed | bad | bad |

Figure 3:
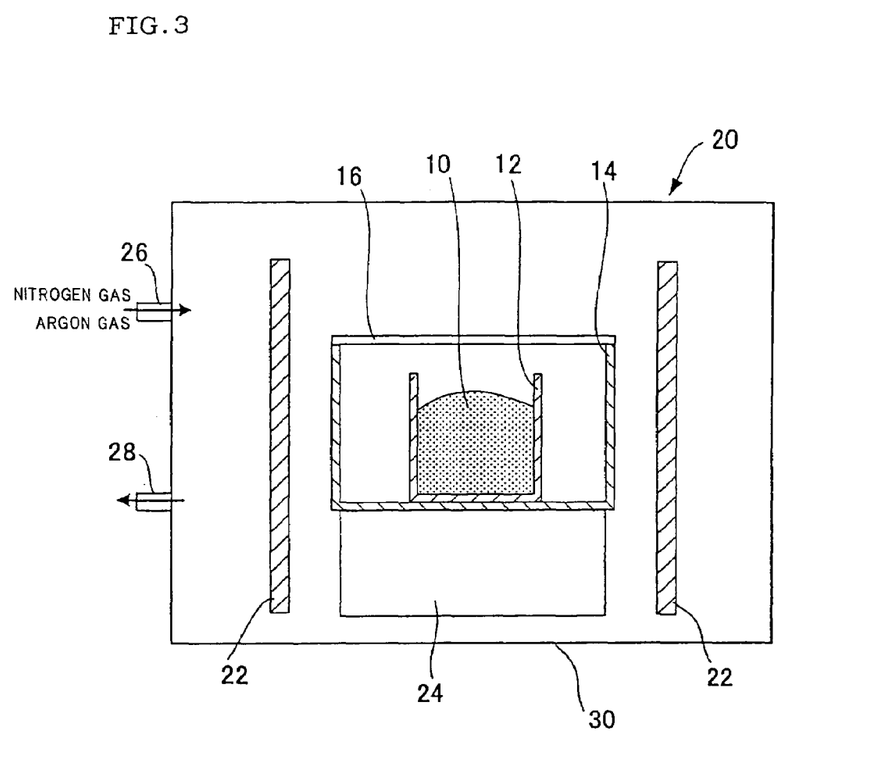
FIG. 3 is a schematic sectional view of a heating furnace usable for a method for manufacturing an aluminum nitride single crystal of the present invention.

With respect to raw material compositions prepared as described above, the synthesis and crystal growth of aluminum nitride was conducted with a heating furnace 20 provided with carbon heaters 22 and a vacuum chamber 30 sa shown in FIG. 3. First, a raw material composition 10 was filled into the first crucible 12 (made of boron nitride and having an inner diameter of 40 mm and a height of 50 mm) having an opening in the upper portion thereof. The first crucible 12 was put in the second crucible 14 (made of carbon and having an inner diameter of 90 mm and a height of 70 mm) which also has an opening in the upper portion thereof and which is larger than the first crucible. The second crucible 14 was sealed at the opening with a lid 16 (made of carbon and having an outer diameter of 100 mm and a thickness of 5 mm) and then disposed on a stage 24 inside the vacuum chamber 30 of a heating furnace 20. Incidentally, carbon powder was not added to the raw material composition as a carbon source in any of Examples and Comparative Examples, and only the carbon heaters 22, the crucible 14, and the lid 16 served as a carbon source. A single crystal substrate was not present in the reaction atmosphere, and the crystal was made to grow on an inner wall of the crucible 12.

Gas was discharged with a vacuum pump from a gas exhaust port 28 to reduce an internal pressure of the vacuum chamber 30 to $5 \times 10^{-4}$ Pa. Then, nitrogen gas or argon gas was supplied in the chamber from a gas induction port to adjust to give an atmospheric pressure shown in Table 1. Then, the temperature was raised up to a temperature shown in Table 1 at a temperature-rising speed of 20° C./min. After the temperature was maintained for two hours, the furnace was cooled down to try synthesis and crystal growth of aluminum nitride. The result is shown in Table 1.

Evaluation

As shown in Table 1, according to the manufacturing method of Examples 1 to 19, a needle-shaped crystal (including a trigonal prism-shaped crystal) was obtained having a length of 5 mm or more and the maximum outer diameter of 0.2 mm or more and a platy crystal having the maximum outer diameter of 1 mm or more and a thickness of 0.1 mm or more, which were sufficiently large for practical use as fillers. These crystals were analyzed by energy dispersive X-ray analysis (EDX) to found that there was no oxygen in the crystals and that elements constituting the crystals were only aluminum and nitrogen. Further, it was confirmed by X-ray diffraction (XRD) that the crystals were aluminum nitride crystals.

Further, by observation with SEM, it was presumed that the needle-shaped crystals were single crystals grown in the (0001) direction because of their hexagonal shape. In addition, it was confirmed by X-ray diffraction that the platy crystals were single crystals whose plate surfaces face (0001) direction. Though growth surfaces of trigonal prism-shaped single crystals are complex and have not yet been made clear, one of crystal surfaces faces (102) direction, and a X-ray rocking curve full width at half maximum for the surface was 18 seconds, which is an excellent value. That is, it was confirmed very well that the crystals were excellent in crystallinity and had very few defects. Further, blue-coloring due to solid-solution of carbon monoxide was not found in these single crystals.

Figure 4:
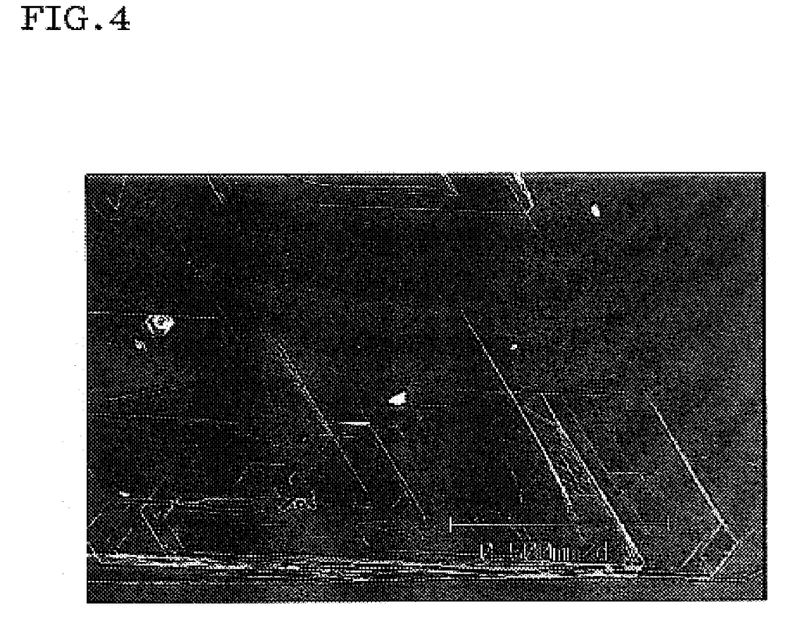
FIG. 4 is a color microphotography showing a platy aluminum nitride single crystal obtained by the manufacture method of Example 17.

Among the methods of Examples 1 to 19, the methods of Examples 5, 6, 11, and 15 to 17 gave platy single crystals each having the maximum outer diameter of 10 mm or more and a thickness of 0.5 mm or more, which is sufficiently large for practical use as a substrate material or the like of parts for electronics or electrical machinery and appliances. FIG. 4 is a microphotograph showing a platy aluminum nitride single crystal obtained by the manufacture method of Example 17. In addition, also the methods of Examples 2, 4, 7 to 10, 12 to 14, 18, and 19 gave platy single crystals each having the maximum outer diameter of 5 mm or more and a thickness of 0.2 mm or more, which is sufficiently large for practical use as a substrate material, showing relatively good results. By investigating the manufacturing conditions such as using a single crystal substrate in a reaction atmosphere in detail in the future, it can be expected to obtain larger platy single crystals.

Figure 5:
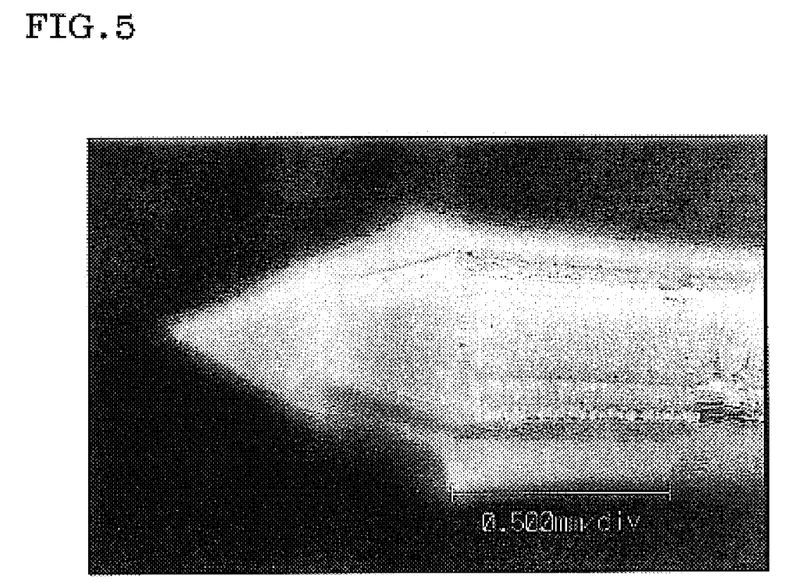
FIG. 5 is a color microphotograph showing a needle-shaped aluminum nitride single crystal obtained by the manufacture method of Example 3.

On the other hand, the methods of Examples 2, 3, 5, 10, and 15 gave needle-shaped crystals each having a length of 20 m or more and the maximum outer diameter of 0.5 mm or more, showing excellent results. FIG. 5 is a microphotograph showing a needle-shaped aluminum nitride single crystal obtained by the manufacturing method of Example 3. Also, the methods of Examples 1 and 17 gave needle-shaped crystals each having a length of 10 mm or more and the maximum outer diameter of 0.5 mm or more, showing relatively good results.

Incidentally, platy single crystals were advantageously formed by the methods of Examples 6, 11, 15 and 17, and needle-shaped crystals by the methods of Examples 2, 3, and 10. It was found that it is possible to control the shape of a single crystal by the manufacturing conditions.

On the other hand, in Comparative Examples 1 to 6 using aluminum oxide or aluminum nitride alone as a raw material composition, the formation of any needle-shaped single crystal having a length of 5 mm or more and the maximum outer diameter of 0.2 mm or more or any platy single crystal having the maximum outer diameter of 1 mm or more and a thickness of 0.1 mm or more was not confirmed at all.

Examples 20 to 34

Synthesis and crystal growth of aluminum nitride was tried in the same manner as in Example 1 except that previously synthesized aluminum oxynitride (synthetic ALON) was used as a raw material. The conditions for the synthesis and crystal growth of aluminum nitride were as described in Table 2. The results were shown in Table 2.

Evaluation

As shown in Table 2, according to the methods of Examples 20 to 34, regardless of conditions, needle-shaped crystals (including trigonal prism-shaped crystals) having a length of 10 mm or more and the maximum outer diameter of 0.5 mm or more and platy crystals having the maximum outer diameter of 1 or more and a thickness of 0.1 mm or more, which are sufficiently large for practical use as a filler, in a short time of 2 hours. These crystals were subjected to energy dispersive X-ray analysis (EDX), and it was found that there was no oxygen in the crystals and that elements constituting the crystals were only aluminum and nitrogen. Further, it was confirmed by X-ray diffraction (XRD) that the crystals were aluminum nitride crystals.

Further, by observation with SEM, it was presumed that the needle-shaped crystals were single crystals grown in the (0001) direction because of their hexagonal shape. In addition, it was confirmed by X-ray diffraction that the platy crystals were single crystals whose plate surfaces face (0001) direction. Though growth surfaces of trigonal prism-shaped single crystals are complex and has not yet made clear, one of crystal surfaces faces (102) direction, and a X-ray rocking curve full width at half maximum for the surface was 18 second, which is an excellent value. That is, it was confirmed that the crystals were excellent in crystallinity and had very few defects.

What is claimed is:

1. A method for manufacturing an aluminum nitride single crystal, the method comprising the steps of:
   preparing a raw material composition comprising at least one of aluminum oxynitride and an aluminum oxynitride precursor which is converted into aluminum oxynitride by heating;
   heating the raw material composition to a temperature in a range of 1600 to 2400° C. to synthesize aluminum nitride; and
   causing crystal growth of the aluminum nitride to obtain an aluminum nitride single crystal.

2. A method for manufacturing an aluminum nitride single crystal according to claim 1 wherein the aluminum oxynitride is at least one selected from the group consisting of $Al_{22}O_{30}N_2$, $Al_{23}O_{27}N_5$, $Al_6O_3N_4$, $Al_7O_3N_5$, and $Al_9O_3N_7$.

TABLE 2

| | Raw material composition (Synthetic ALOM) | Reaction crystal growth condition | | | Single Crystal | | |
|---|---|---|---|---|---|---|---|
| | | Temperature (° C.) | Atmosphere | Atmospheric pressure (kPa) | Shape | Size | |
| | | | | | | Needle-shaped crystal | Platy crystal |
| Example 20 | $Al_{23}O_{27}N_5$ | 2230 | Nitrogen | 100(1 atm) | Needle | Good | Excellent |
| Example 21 | $Al_6O_3N_4$ | 2000 | Nitrogen | 100(1 atm) | Needle | Excellent | Fair |
| Example 22 | $Al_6O_3N_4$ | 2000 | Nitrogen · Argon = 1.4 | 100(1 atm) | Needle | Excellent | Fair |
| Example 23 | $Al_6O_3N_4$ | 2100 | Nitrogen | 100(1 atm) | Needle, plate | Good | Excellent |
| Example 24 | $Al_6O_3N_4$ | 2100 | Nitrogen · Argon = 1.4 | 100(1 atm) | Needle, plate | Good | Excellent |
| Example 25 | $Al_6O_3N_4$ | 2200 | Nitrogen | 100(1 atm) | Needle, plate | Good | Excellent |
| Example 26 | $Al_6O_3N_4$ | 2200 | Nitrogen · Argon = 1.4 | 100(1 atm) | Needle, plate | Good | Excellent |
| Example 27 | $Al_6O_3N_4$ | 2200 | Nitrogen | 20(0.2 atm) | Needle, plate | Good | Excellent |
| Example 28 | $Al_7O_3N_5$ | 2000 | Nitrogen | 100(1 atm) | Needle | Excellent | Fair |
| Example 29 | $Al_7O_3N_5$ | 2000 | Nitrogen · Argon = 1.4 | 100(1 atm) | Needle | Excellent | Fair |
| Example 30 | $Al_7O_3N_5$ | 2100 | Nitrogen | 100(1 atm) | Needle, plate | Good | Excellent |
| Example 31 | $Al_7O_3N_5$ | 2100 | Nitrogen · Argon = 1.4 | 100(1 atm) | Needle, plate | Good | Excellent |
| Example 32 | $Al_7O_3N_5$ | 2200 | Nitrogen | 100(1 atm) | Needle, plate | Good | Excellent |
| Example 33 | $Al_7O_3N_5$ | 2200 | Nitrogen · Argon = 1.4 | 100(1 atm) | Needle, plate | Good | Excellent |
| Example 34 | $Al_7O_3N_5$ | 2200 | Nitrogen | 20(0.2 atm) | Needle, plate | Good | Excellent |

3. A method for manufacturing an aluminum nitride single crystal according to claim 1 wherein the synthesis and the crystal growth of the aluminum nitride is performed in the presence of carbon.

4. A method for manufacturing an aluminum nitride single crystal according to claim 3 wherein the synthesis and the crystal growth of the aluminum nitride is performed under the condition that carbon powder is used as the carbon and that the carbon powder is mixed with the raw material composition.

5. A method for manufacturing an aluminum nitride single crystal according to claim 1 wherein the synthesis and the crystal growth of aluminum nitride is performed in a graphite or nitride reaction container.

6. A method for manufacturing an aluminum nitride single crystal according to claim 1 wherein the synthesis and the crystal growth of the aluminum nitride is performed in a reaction atmosphere containing at least one of a nitrogen gas and a nitrogen compound gas, wherein a partial pressure of the at least one of the nitrogen gas and the nitrogen compound gas is in a range of 1 kPa to 1 Mpa.

7. A method for manufacturing an aluminum nitride single crystal according to claim 1 wherein a single crystal substrate is present in the reaction atmosphere to causes the crystal growth of the aluminum nitride on a surface of the single crystal substrate.

8. A method for manufacturing an aluminum nitride single crystal according to claim 7 wherein the crystal growth of the aluminum nitride is performed under the condition that a difference in temperature between the raw material composition and the single crystal substrate is controlled to be 20° C. or more.

9. A method for manufacturing an aluminum nitride single crystal, the method comprising the steps of:
preparing a raw material composition comprising:
at least one of aluminum oxide ($Al_2O_3$) and an aluminum oxide precursor which is converted into aluminum oxide by heating, and at least one of aluminum nitride (AlN) and an aluminum nitride precursor which converted into aluminum nitride by heating;
heating the raw material composition to a temperature in a range of 1600 to 2400° C. to synthesize aluminum nitride; and
causing crystal growth of the aluminum nitride to obtain an aluminum nitride single crystal.

10. A method for manufacturing an aluminum nitride single crystal according to claim 9 wherein the raw material composition satisfies a relationship shown by the following formula (1):

$$(N_{AO}+N_{AO\text{-}pre}):(N_{AN}+N_{AN\text{-}pre})=95:5 \text{ to } 10:90 \qquad (1);$$

wherein $N_{AO}$ represents a molar number of aluminum oxide, $N_{AO\text{-}pre}$ represents a molar number of aluminum oxide precursor in terms of aluminum oxide, $N_{AN}$ represents a molar number of aluminum nitride, and $N_{AN\text{-}pre}$ represents a molar number of aluminum nitride precursor in terms of aluminum nitride.

11. A method for manufacturing an aluminum nitride single crystal according to claim 9 wherein the synthesis and the crystal growth of the aluminum nitride is performed in the presence of carbon.

12. A method for manufacturing an aluminum nitride single crystal according to claim 11 wherein the synthesis and the crystal growth of the aluminum nitride is performed under the condition that carbon powder is used as the carbon and that the carbon powder is mixed with the raw material composition.

13. A method for manufacturing an aluminum nitride single crystal according to claim 9 wherein the synthesis and the crystal growth of aluminum nitride is performed in a graphite or nitride reaction container.

14. A method for manufacturing an aluminum nitride single crystal according to claim 9 wherein the synthesis and the crystal growth of the aluminum nitride is performed in a reaction atmosphere containing at least one of a nitrogen gas and a nitrogen compound gas, wherein a partial pressure of the at least one of the nitrogen gas and the nitrogen compound gas is in a range of 1 kPa to 1 Mpa.

15. A method for manufacturing an aluminum nitride single crystal according to claim 9 wherein a single crystal substrate is present in the reaction atmosphere to cause the crystal growth of the aluminum nitride on a surface of the single crystal substrate.

16. A method for manufacturing an aluminum nitride single crystal according to claim 15 wherein the crystal growth of the aluminum nitride is performed under the condition that a difference in temperature between the raw material composition and the single crystal substrate is controlled to be 20° C. or more.

* * * * *

UNITED STATES PATENT AND TRADEMARK OFFICE
CERTIFICATE OF CORRECTION

| | |
|---|---|
| PATENT NO. | : 7,332,027 B2 |
| APPLICATION NO. | : 11/172108 |
| DATED | : February 19, 2008 |
| INVENTOR(S) | : Yoshimasa Kobayashi, Toru Hayase and Naohito Yamada |

It is certified that error appears in the above-identified patent and that said Letters Patent is hereby corrected as shown below:

Column 1
   *Lines 8-11*: please delete the paragraph beginning with "This application claims the benefit …"
   *Line 25*: please change "values" to --value--.

Column 16
   *Line 28*: please add the following before "What is claimed is:":
--Further, blue-coloring due to solid-solution of carbon monoxide was not found in these single crystals.
   Among the methods of Examples 20 to 34, the methods of Examples 20, 23 to 27, and 29 to 34 gave platy single crystals each having the maximum outer diameter of 10 mm or more and a thickness of 0.5 mm or more, which is sufficiently large for practical use as a substrate material or the like of parts for electronics or electrical machinery and appliances, showing excellent results. In addition, also the methods of Examples 21, 22, 28, and 29 gave needle-shaped single crystals each having a length of 20 mm or more and the maximum outer diameter of 0.5 mm or more, which is sufficiently large for practical use as a substrate material, showing excellent results.
   The method for manufacturing an aluminum nitride single crystal of the present invention can preferably be used for manufacturing an aluminum nitride single crystal (bulk single crystal or whisker) useful as a dispersant (filler) for improving mechanical strength and heat radiation ability of metals or plastics, or as a substrate material, heat radiating material, or structural material for parts for electronics or electrical machinery and appliances, as well as a semi-conductive laser element and light-emitting diode.--

UNITED STATES PATENT AND TRADEMARK OFFICE
CERTIFICATE OF CORRECTION

PATENT NO. : 7,332,027 B2
APPLICATION NO. : 11/172108
DATED : February 19, 2008
INVENTOR(S) : Yoshimasa Kobayashi, Toru Hayase and Naohito Yamada It is certified that error appears in the above-identified patent and that said Letters Patent is hereby corrected as shown below:

Column 17
    *Line 24*: please change "causes" to --cause--
    *Line 40*: please add --is-- after "which"

Signed and Sealed this

Eighth Day of July, 2008

JON W. DUDAS
*Director of the United States Patent and Trademark Office*